US008106476B2

(12) United States Patent
Wu et al.

(10) Patent No.: US 8,106,476 B2
(45) Date of Patent: Jan. 31, 2012

(54) SEMICONDUCTOR DIE WITH FUSE WINDOW AND A MONITORING WINDOW OVER A STRUCTURE WHICH INDICATES FUSE INTEGRITY

(75) Inventors: Robert I. Wu, Ladera Ranch, CA (US); Robert Lutze, Irvine, CA (US); Jung Kuan Wang, Laguna Niguel, CA (US); Voon Yean Ten, Nuovo EC (SG); Liming Tsau, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1069 days.

(21) Appl. No.: 11/891,902

(22) Filed: Aug. 13, 2007

(65) Prior Publication Data

US 2009/0045400 A1 Feb. 19, 2009

(51) Int. Cl.
*H01L 23/525* (2006.01)
(52) U.S. Cl. .................... 257/529; 257/E23.15
(58) Field of Classification Search .......... 257/529, 257/E21.592, E23.149, E23.15, 528, 530, 257/758, 773, E23.146, E23.147, E23.148, 257/E21.591, E21.596
See application file for complete search history.

(56) References Cited

U.S. PATENT DOCUMENTS

| 6,228,684 | B1 * | 5/2001 | Maruyama | 438/113 |
| 6,806,107 | B1 * | 10/2004 | Wu | 438/18 |
| 6,844,218 | B2 * | 1/2005 | Potts | 438/110 |
| 7,323,760 | B2 * | 1/2008 | Sakoh | 257/529 |
| 7,763,887 | B2 * | 7/2010 | Han | 257/48 |
| 2004/0113233 | A1 * | 6/2004 | Kim | 257/529 |

* cited by examiner

*Primary Examiner* — Samuel Gebremariam
*Assistant Examiner* — Andrew O. Arena
(74) *Attorney, Agent, or Firm* — Farjami & Farjami LLP

(57) ABSTRACT

According to one exemplary embodiment, a method for monitoring structural integrity of at least one fuse in semiconductor wafer, which includes at least one electrical monitoring structure, includes forming a monitoring window in a dielectric layer overlying the at least one electrical monitoring structure, where the monitoring window and a fuse window overlying the at least one fuse are, in one embodiment, formed in a same etch process. The method further includes performing at least one electrical measurement on the at least one electrical monitoring structure, wherein the at least one electrical measurement is utilized to monitor the structural integrity of the at least one fuse. A change in the at least one electrical measurement is utilized to indicate a change in the structural integrity of the at least one fuse. The at least one electrical monitoring structure can include, for example, a metal serpentine line and one or more metal combs.

16 Claims, 5 Drawing Sheets

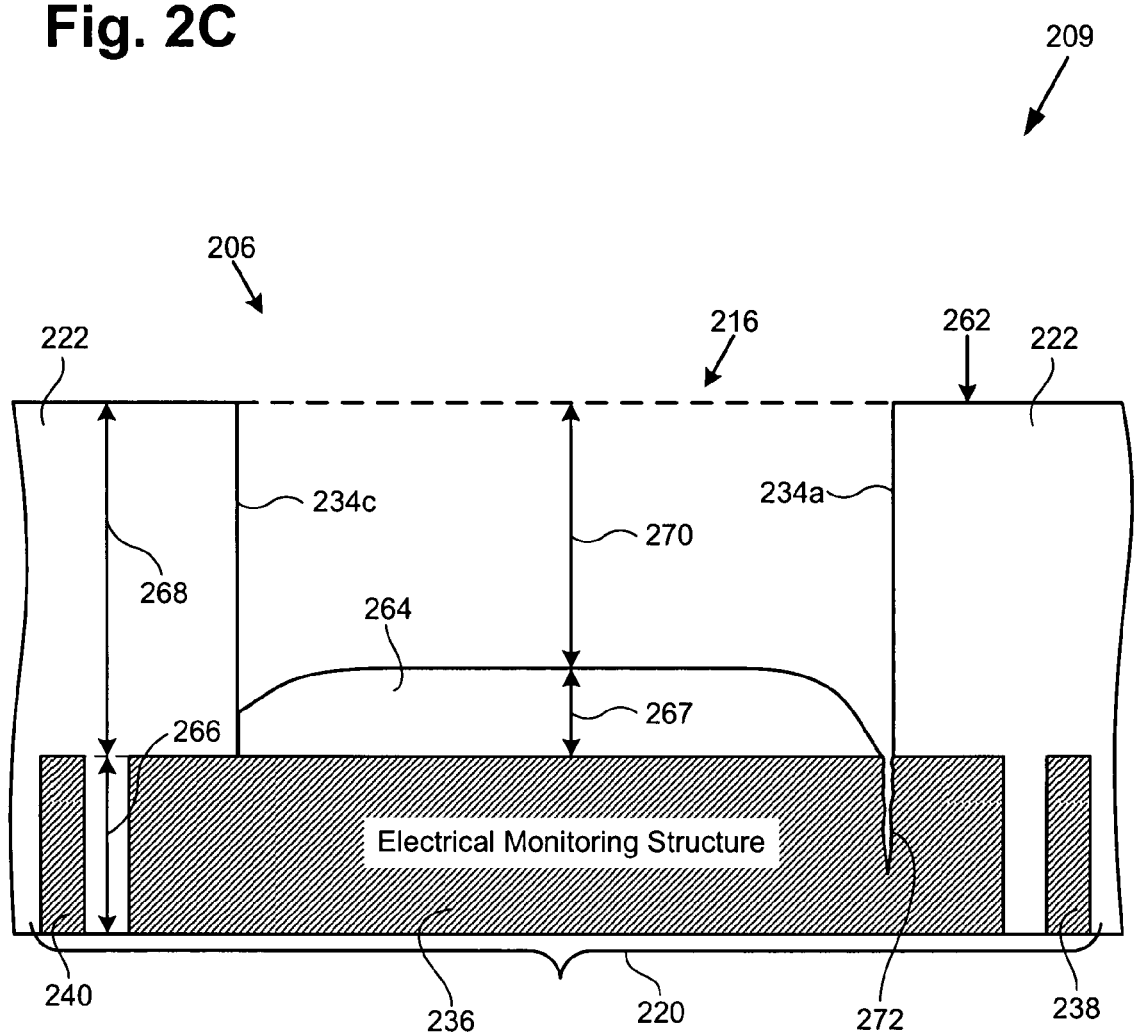

SEMICONDUCTOR DIE WITH FUSE WINDOW AND A MONITORING WINDOW OVER A STRUCTURE WHICH INDICATES FUSE INTEGRITY

BACKGROUND OF THE INVENTION

1. Field of the Invention

The present invention is generally in the field of semiconductors. More particularly, the invention is in the field of fuses in semiconductor dies.

2. Background Art

Fuses, for example, fuses that can be blown by a laser ("laser fuses"), can be utilized in integrated circuit (IC) dies to perform various functions such as, for example, providing redundancy in semiconductor memory, trimming, e.g., adjusting resistance or capacitance values in a circuit, and chip ID. Laser fuses, which can comprise a metal, such as copper, are typically formed in a high interconnect metal layer, such as a top interconnect metal layer, in the die and are covered by a thick dielectric layer. To enable the laser fuse to be blown by a laser, a fuse window can be formed by using an etch process to thin a portion of the dielectric layer overlying the laser fuse. The remaining portion of the dielectric layer overlying the laser fuse after formation of the fuse window must be sufficiently thin so as to allow laser fuse to be blown by the laser while providing adequate protection to the laser fuse.

However, due to an anomaly, the etch process may etch through the dielectric layer at, for example, an edge of the fuse window and expose the underlying fuse metal. As a result, an etch chemistry utilized in the etch process can attack the fuse metal and, thereby, damage to the laser fuse. For example, the etch chemistry may remove enough fuse metal so as to cause an unblown laser fuse to be in a blown condition. Thus, it is important to determine if the structural integrity of a laser fuse has been compromised by the etch process during fuse window formation.

In a conventional approach, fuse windows can be visually inspected during wafer fabrication to determine if underlying laser fuses have been compromised by the etch process. However, since a wafer may include hundreds of dies that can each include, for example, as many as ten fuse windows, a visual inspection of each fuse window is not feasible. Thus, the conventional approach typically employs a spot inspection, wherein only some of the fuse windows in some of the dies on the wafer are randomly inspected. However, since different areas of the wafer may etch at different rates, some dies on the wafer may have fuse windows with defects that can compromise an underlying laser fuse while other dies on the wafer may have fuse windows that are defect free. Thus, the spot visual inspection provided by the conventional approach may not detect defective fuse windows on some dies. Also, the conventional approach may not be sensitive enough to detect minor laser fuse damage, which can undesirably affect the integrity and reliability of the laser fuse.

SUMMARY OF THE INVENTION

A method for monitoring fuse integrity in a semiconductor die and related structure substantially as shown in and/or described in connection with at least one of the figures, as set forth more completely in the claims.

BRIEF DESCRIPTION OF THE DRAWINGS

FIG. 2C illustrates a cross-sectional view of the exemplary laser fuse monitor of FIG. 2A.

DETAILED DESCRIPTION OF THE INVENTION

The present invention is directed to a method for monitoring fuse integrity in a semiconductor die and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
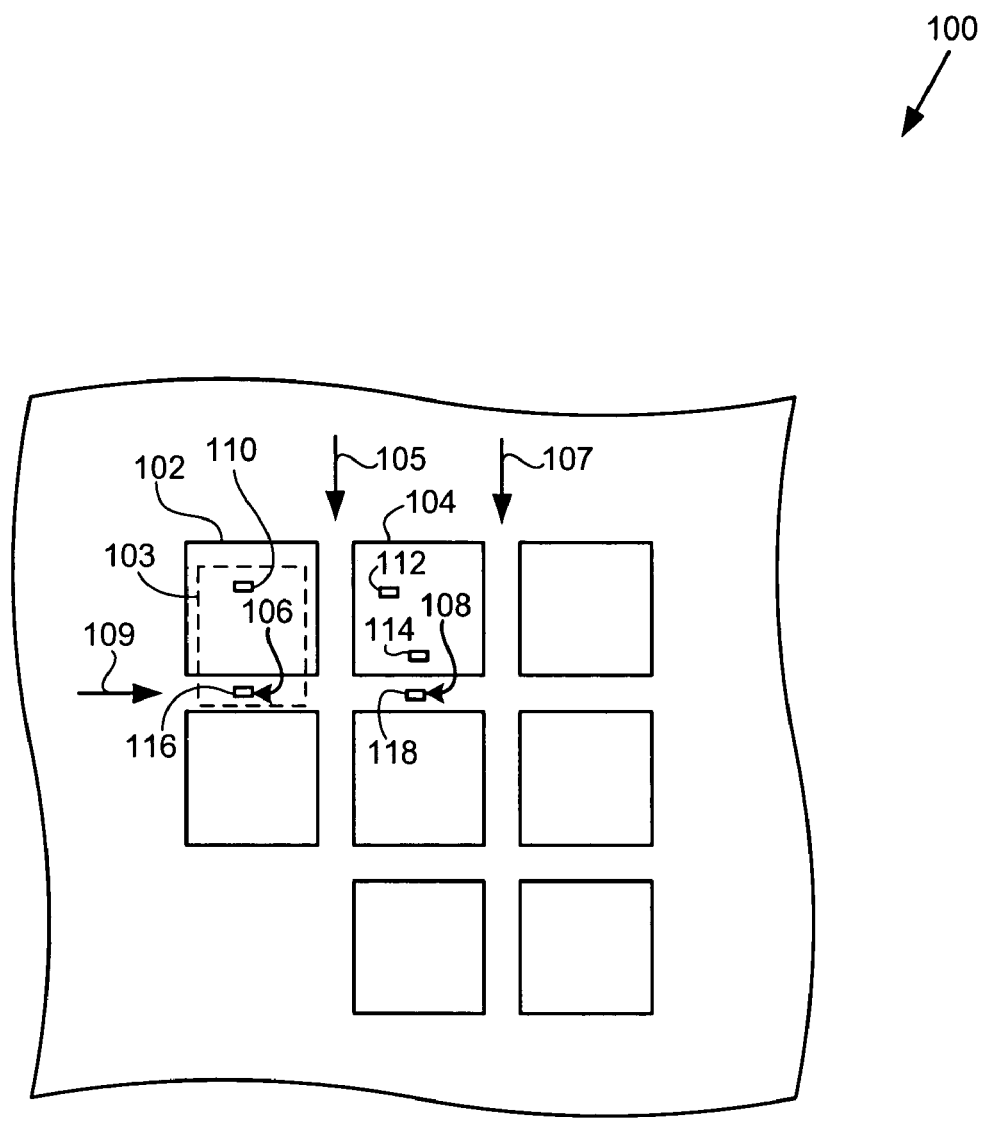
FIG. 1 illustrates a top view of a portion of an exemplary wafer including exemplary laser fuse monitors in accordance with one embodiment of the present invention.

FIG. 1 shows a top view of a portion of a semiconductor wafer (hereinafter also referred to simply as "wafer 100" for ease of reference) including exemplary laser fuse monitors in accordance with one embodiment of the present invention. Wafer 100 includes a number of semiconductor dies, such as semiconductor dies 102 and 104, and a number of scribe lines, such as scribe lines 105, 107, and 109. Each scribe line in wafer 100 can include at least one laser fuse monitor, such as laser fuse monitors 106 and 108, which are situated in scribe line 109. Each semiconductor die in wafer 100 can include at least one fuse window, such as fuse window 110, which is situated in semiconductor 102. Each fuse window, such as fuse windows 110, 112, and 114, is formed over at least one laser fuse (not shown in FIG. 1). In wafer 100, a scribe line, such as scribe line 105, 107, or 109, can be formed between each row and each column of semiconductor dies to provide a path along which the wafer can be sawn in a saw singulation process. It is noted that only semiconductor dies 102 and 104, laser fuse monitors 106 and 108, scribe lines 105, 107, and 109, and fuse windows 110, 112, and 114 in FIG. 1 are discussed herein to preserve brevity.

As shown in FIG. 1, laser fuse monitors 106 and 108 include respective monitoring windows 116 and 118, which are formed in a dielectric layer. Monitoring windows 116 and 118 each overlie an electrical monitoring structure (not shown in FIG. 1), which can be, for example, a metal comb/serpentine structure. The metal comb/serpentine structure, which might comprise a metal serpentine line situated between interdigitated metal lines of two metal combs, can be a conventional test structure that is typically formed in a semiconductor wafer to measure metal resistance and leakage. More generally, other test structures and, in particular, variations of the conventional metal comb/serpentine structure, e.g. a serpentine structure situated adjacent to only one metal comb, instead of being situated between two metal combs, might also be used.

In the present embodiment, a window opening, such as monitoring window 116, can be formed over at least one electrical monitoring structure, such as a metal comb/serpentine structure, in a scribe line in wafer 100 by utilizing the same process step and etch process that is utilized to form one or more fuse windows, such as fuse window 110, in a semiconductor die in the wafer. As a result, the monitoring window in combination with the underlying electrical monitoring structure form a laser fuse monitor, such as laser fuse monitor 106, which can monitor the structural integrity of one or more laser fuses underlying a corresponding fuse window. An embodiment of the invention's laser fuse monitor will be further discussed below in relation to FIGS. 2A and 2C.

Figure 2A:
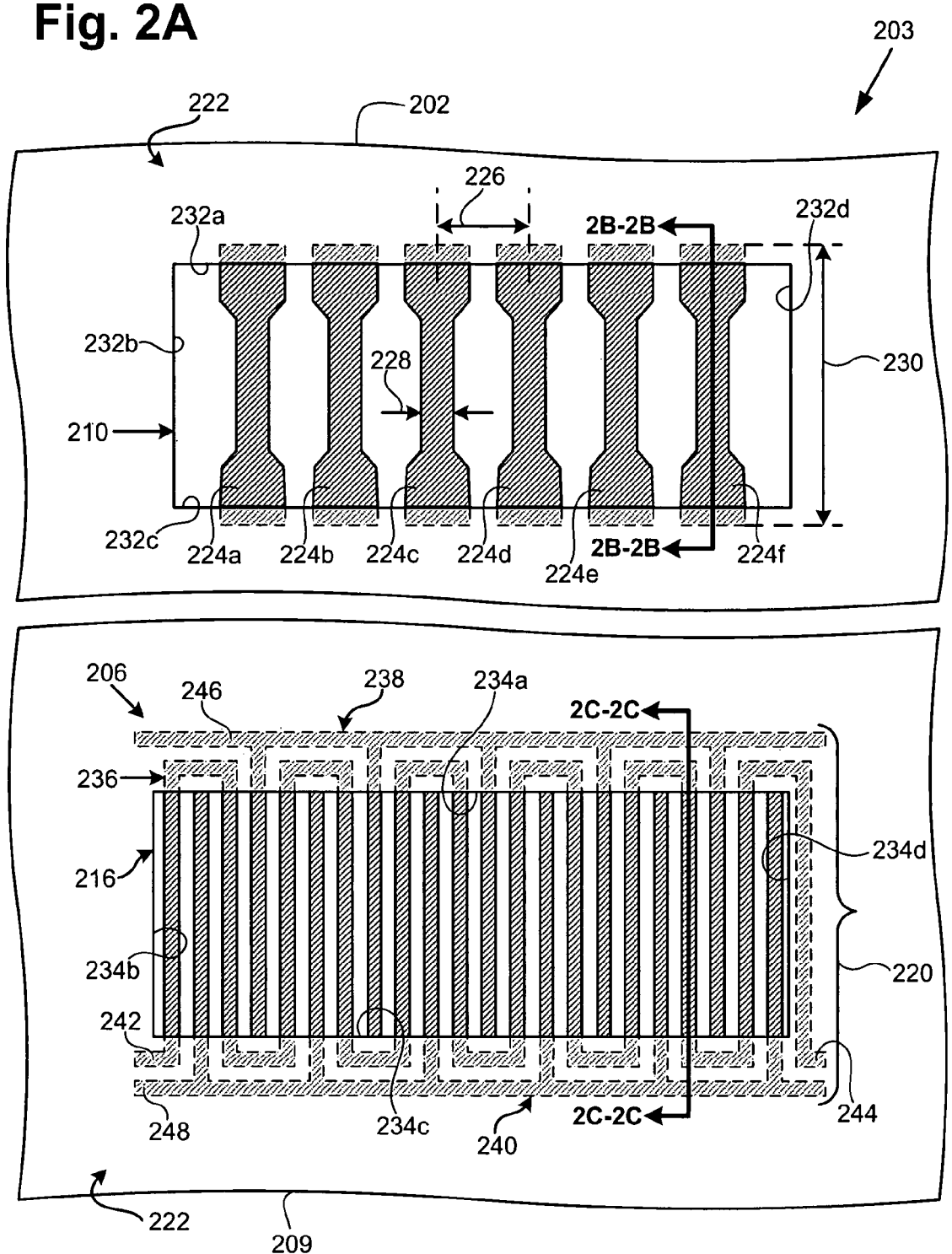
FIG. 2A illustrates a top view of a portion of FIG. 1, including an exemplary fuse window overlying a number of laser fuses and an exemplary laser fuse monitor in accordance with one embodiment of the present invention.

FIG. 2A shows a top view of a portion of FIG. 1 in accordance with one embodiment of the present invention. In FIG. 2A, portion 203 corresponds to the portion of wafer 100 indicated by dashed line 103 in FIG. 1. In particular, semiconductor die 202, laser fuse monitor 206, scribe line 209, fuse window 210, and monitoring window 216 in correspond, respectively, to semiconductor die 102, laser fuse monitor 106, scribe line 109, fuse window 110, and monitoring window 116 in FIG. 1. Laser fuse monitor 206 includes monitoring window 216 and electrical monitoring structure 220. In the embodiment of FIG. 2A, fuse window 210 overlies six laser fuses, i.e., laser fuses 224a, 224b, 224c, 224d, 224e, and 224f (hereafter laser fuses 224a through 224f). However, in other embodiments, a fuse window, such as fuse window 210, may overlie more or less than six laser fuses. It is noted that although "laser fuses" are used as primary examples in the present application, the concepts of the present invention can apply to other types of fuses as well.

As shown in FIG. 2A, fuse window 210, which has sidewalls 232a, 232b, 232c, and 232d, is situated in dielectric layer 222, which can comprise an oxide-based dielectric material, such as silicon oxide. However, dielectric layer 222 can also comprise other types of dielectric material, which can include low dielectric constant (low-k) dielectric material, intermediate-k dielectric material, or high-k dielectric material. Also shown in FIG. 2A, fuse window 210 is situated over laser fuses 224a through 224f. Laser fuses 224a through 224f are designed to be blown, i.e., electrically opened, by a laser beam and can be utilized to increase semiconductor die yield in wafer fabrication. Laser fuses 224a through 224f can perform various functions in the die, such as, for example, trimming, chip ID, and memory repair, as well as other functions as known in the art.

Laser fuses 224a through 224f can comprise, for example, copper. However, laser fuses 224a through 224f can also comprise a metal other than copper. Laser fuses 224a through 224f can be fabricated in, for example, the top interconnect metal layer in semiconductor die 202. However, laser fuses 224a through 224f may also be fabricated in an interconnect metal layer that is situated below the top interconnect metal layer in the die. Laser fuses 224a through 224f have pitch 226, which refers to the distance between the lengthwise centers of adjacent laser fuses. Pitch 226 can be selected so as to allow a laser beam to blow one of laser fuses 224a through 224f without damaging an adjacent laser fuse. Laser fuses 224a through 224f have width 228, which can be, for example, approximately 1.5 microns. However, width 228 can also be greater than or less than 1.5 microns. Laser fuses 224a through 224f have length 230, which can be, for example, approximately 10.0 microns. However, length 230 may also be greater than or less than 10.0 microns.

Fuse window 210 can be fabricated by utilizing an etch process, such as a reactive ion etch process or other suitable etch process as known in art, to remove a portion of dielectric layer 222 overlying laser fuses 224a through 224f. As a result of the etch process utilized to form fuse window 210, a portion of dielectric layer 222 remains situated over laser fuses 224 through 224f. The portion of dielectric layer 222 remaining over fuses 224a through 224f in fuse window 210 is not shown in FIG. 2A so as to more clearly illustrate fuses 224a through 224f. The remaining portion of dielectric layer 222 (not shown in FIG. 2A) overlying laser fuses 224a through 224f has a thickness that is selected to allow one or more of laser fuses 224a through 224f to be blown by a laser beam through fuse window 210.

Further shown in FIG. 2A, monitoring window 216, which includes sidewalls 234a, 234b, 234c, and 234d, is situated over electrical monitoring structure 220 in dielectric layer 222 in scribe line 209. Monitoring window 216 is formed in dielectric layer 222 in the same process step in which fuse window 210 is formed. Monitoring window 216 is also formed by utilizing the same the etch process that is utilized to form fuse window 210. As a result of the etch process utilized to form monitoring window 216, a portion of dielectric layer 222 remains situated over electrical monitoring structure 220. The portion of dielectric layer 222 remaining over electrical monitoring structure 220 is not shown in FIG. 2A so as to more clearly illustrate electrical monitoring structure 220. Monitoring window 216 is further discussed below in relation to FIG. 2C.

In the present embodiment, electrical monitoring structure 220 can be a metal comb/serpentine structure, which includes metal serpentine line 236, metal comb 238, and metal comb 240. In another embodiment, electrical monitoring structure 220 can be a metal structure other than a metal comb/serpentine structure. Electrical monitoring structure 220 is a conventional monitoring structure that is typically formed in a scribe line in a wafer, such as wafer 100, to measure metal resistance and leakage. Electrical monitoring structure 220 can be formed in the same interconnect metal layer in the wafer as laser fuses 224a through 224f. Electrical monitoring structure 220 can also be formed to minimum design rule requirements.

As shown in FIG. 2A, metal serpentine line 236 is situated between the interdigitated metal lines of metal comb 238 and metal comb 240. Metal serpentine line 236 includes terminals 242 and 244, metal comb 238 includes terminal 246, and metal comb 240 includes terminal 248. An eroded metal segment in metal serpentine line 236 can be indicated by a high resistance as measured between terminals 242 and 244 of metal serpentine line 236. A short or bridge formed between metal comb 238 and metal serpentine line 236 can be indicated by a low resistance as measured between terminals 242 or 244 of metal serpentine line 236 and terminal 246 of metal comb 238. Similarly, a short or bridge formed between metal comb 240 and metal serpentine line 236 can be indicated by a low resistance as measured between terminals 242 or 244 of metal serpentine line 236 and terminal 248 of metal comb 246.

In the present embodiment, monitoring window 216 is formed in dielectric layer 222 over electrical monitoring structure 220 in the same process step in which fuse window 210 is formed over laser fuses 224a through 224f. Also, monitoring window 216 is formed in scribe line 209, which is situated adjacent to the semiconductor die in which fuse window 210 is formed, i.e., semiconductor die 202, in the wafer. As a result, laser fuse monitor 206, which includes monitoring window 216 and electrical monitoring structure 220, can be utilized to monitor the structural integrity of laser fuses 224a through 224f through electrical measurements performed on electrical monitoring structure 220.

Figure 2B:
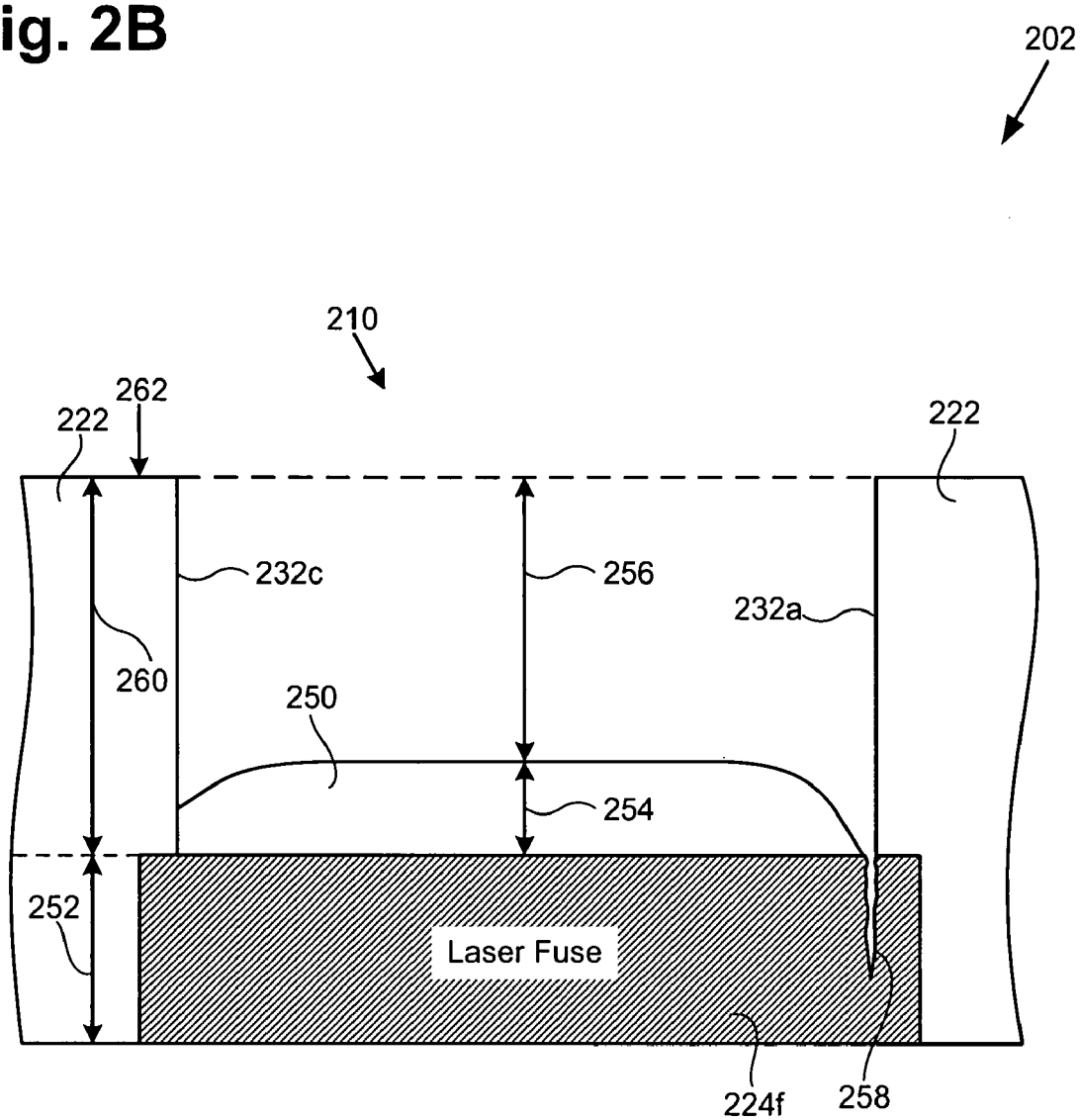
FIG. 2B illustrates a cross-sectional view of the exemplary fuse window and an exemplary laser fuse of FIG. 2A.

FIG. 2B shows a cross-sectional view of semiconductor die 202 in FIG. 2A along line 2B-2B in FIG. 2A. In particular, fuse window 210, laser fuse 224f, sidewalls 232a and 232c, and dielectric layer 222 correspond to the same elements in FIG. 2A and FIG. 2B. As shown in FIG. 2B, dielectric portion 250 of dielectric layer 222 in fuse window 210 is situated over laser fuse 224f. Laser fuse 224f has thickness 252, which can be, for example, approximately 5000.0 Angstroms. However, thickness 252 may also be less than or more than 5000.0 Angstroms. Dielectric portion 250 is a portion of dielectric layer 222 that remains over laser fuse 224f after fuse window 210 has been formed. Dielectric portion 250 has thickness 254, which can be, for example, approximately 2500.0 Angstroms. However, thickness 254 may also be less than or greater than 2500.0 Angstroms. Dielectric layer 222 can have thickness 260 between top surface 262 of dielectric layer 222 and the top surface of laser fuse 224f. For example, thickness 260 can be approximately 10,000 Angstroms. However, thickness 260 can also be less than or greater than 10,000 Angstroms.

Fuse window 210 has depth 256, which can be, for example, approximately 7500.0 Angstroms. However, depth 256 may also be less than or greater than 7500.0 Angstroms. During formation, fuse window 210 is intended to have a uniform depth between sidewalls 232a and 232c. However, due to an anomaly, i.e., an aberration, in the etch process utilized to form fuse window 210, the depth of fuse window 210 can vary between sidewalls 232a and 232c. As a result, the thickness of dielectric portion 250 can correspondingly vary across the length of laser fuse 224f. As shown in FIG. 2B, the depth of fuse window 210 has increased at sidewalls 232c and 232a during the etch process such that a portion of laser fuse 224f is exposed at sidewall 232a. If a portion of laser fuse 224f is exposed, the etch chemistry utilized in the etch process, or a cleaning agent utilized in a subsequent cleaning process, can attack the fuse metal, i.e., the metal that forms the laser fuse, and, thereby, damage the laser fuse. For example, the etch chemistry can cause a crevice, such as crevice 258, to form in the laser fuse by eroding the fuse metal.

Thus, as a result of an anomaly in the etch process, the integrity of laser fuse 224f can be undesirably compromised by damage to the fuse metal caused by exposure to the etch chemistry, thereby reducing the reliability of the laser fuse. If the damage to the laser fuse caused by the etch chemistry is sufficiently severe, the laser fuse may be effectively and unintendedly sensed as blown.

FIG. 2C shows a cross-sectional view of scribe line 209 in FIG. 2A along line 2C-2C in FIG. 2A. In particular, laser fuse monitor 206, monitoring window 216, electrical monitoring structure 220, dielectric layer 222, sidewalls 234a and 234c, metal serpentine line 236, and metal combs 238 and 240 correspond to the same elements in FIG. 2A and FIG. 2C. Also, top surface 262 corresponds to the same element in FIG. 2B and FIG. 2C. In FIG. 2C, fuse monitor 206 includes monitoring window 216 and electrical monitoring structure 220.

As shown in FIG. 2C, monitoring window 216 is situated over dielectric portion 264 of dielectric layer 222 and dielectric portion 264 is situated over electrical monitoring structure 220. Electrical monitor structure 220 has thickness 266, which can be approximately equal to thickness 252 of laser fuse 224f in FIG. 2B. Dielectric portion 264 is a portion of dielectric layer 222 that remains over electrical monitoring structure 220 after monitoring window 216 has been formed in dielectric layer 222. Dielectric portion 264 has thickness 267, which can be approximately equal to thickness 254 of dielectric portion 250, which is situated over laser fuse 224f in FIG. 2B. Dielectric layer 222 can have thickness 268 between top surface 262 of dielectric layer 222 and the top surface of electrical monitoring structure 220. Thickness 268 can be approximately equal to thickness 260, i.e., the thickness of dielectric layer 222 between top surface 262 and the top surface of laser fuse 224f.

Monitoring window 216 has depth 270, which can be approximately equal to the depth of fuse window 210, i.e., depth 256, which is shown in FIG. 2B. During formation, monitoring window 216 is intended to have a uniform depth. However, due to an anomaly in the etch process that is utilized to form monitoring window 216, which is the same etch process that is utilized to form fuse window 210 in FIG. 2B, the depth of monitoring window 216 can vary between sidewalls 234a and 234c of the monitoring window. As a result, the thickness of dielectric portion 264 can correspondingly vary between sidewalls 234a and 234c of monitoring window 216.

As shown in FIG. 2C, the depth of monitoring window 216 has increased at sidewalls 234c and 234a during the etch process such that a portion of metal serpentine line 236 in electrical monitoring structure 220 is exposed. If a portion of electrical monitoring structure 220 is exposed, such as a portion of metal serpentine line 236, the etch chemistry utilized in the etch process, or a cleaning agent utilized in a subsequent cleaning process, can attack the exposed metal and, thereby, damage the electrical monitoring structure. For example, the etch chemistry can cause a crevice, such as crevice 272, to form by eroding the exposed metal in metal serpentine line 236.

Since damage to a laser fuse, such as laser fuse 224f, and damage to electrical monitoring structure 220 are caused by an anomaly in the same etch process that is utilized to form fuse window 210 and monitoring window 216, the damage, e.g., crevice 272, caused to electrical monitoring structure 220 can correspond to the damage, e.g., crevice 258, caused to a laser fuse, such as laser fuse 224f. The damage caused to electrical monitoring structure 220 by an anomaly in the etch process utilized to form monitoring window 216 can be detected or sensed by performing an electrical measurement, such as a resistance measurement, on electrical monitoring structure 220. For example, a crevice, such as crevice 272, form in metal serpentine line 236 of electrical monitoring structure 220 can be detected by a significant increase in the resistance of metal serpentine line 236, which can be measured between terminals 242 and 244 of metal serpentine line 236. For example, a bridge or short formed between metal combs 238 or 240 and metal serpentine line 236 caused by an anomaly in the etch process utilized to form overlying monitoring window 216 can be detected by a significant reduction in resistance as measured between respective metal combs 238 or 240 and metal serpentine line 236.

Also, a current measurement can be performed on electrical monitoring structure 220 to detect damage to electrical monitoring structure 220 caused by etch chemistry as a result of an anomaly in the etch process. For example, a bridge formed between metal combs 238 or 240 and metal serpentine line 236 can be detected by a significant increase in leakage current as measured between respective metal combs 238 or 240 and metal serpentine line 236.

Since monitoring window 216 can be formed in the same process step and by the same etch process as fuse window 210, damage caused to electrical monitoring structure 220 as a result of an anomaly in the etch process can correspond to damage caused to a laser fuse, such as laser fuse 224f, as a result of the same anomaly in the etch process. Thus, electrical measurements performed on electrical monitoring structure 220 can be utilized to sense or detect damage to one or more laser fuses underlying fuse window 210. Damage to a laser fuse caused by exposure to an etch chemistry utilized in an etch process during formation of an overlying fuse window can undesirably reduce the structural integrity of the laser fuse.

Thus, by performing electrical measurements, such as current or resistance measurements, on an electrical monitoring structure underlying a monitoring window, the present invention can advantageously monitor the structural integrity of one or more laser fuses situated under a fuse window. Thus, a change in an electrical measurement performed on the electrical monitoring structure can be utilized in the present invention to sense a change in the structural integrity of one or more laser fuses and, thereby, to detect damage to the one or more laser fuses. Also, the present invention provides sufficient sensitivity so as to detect subtle structural changes that can compromise the structural integrity of a laser fuse.

Figure 3:
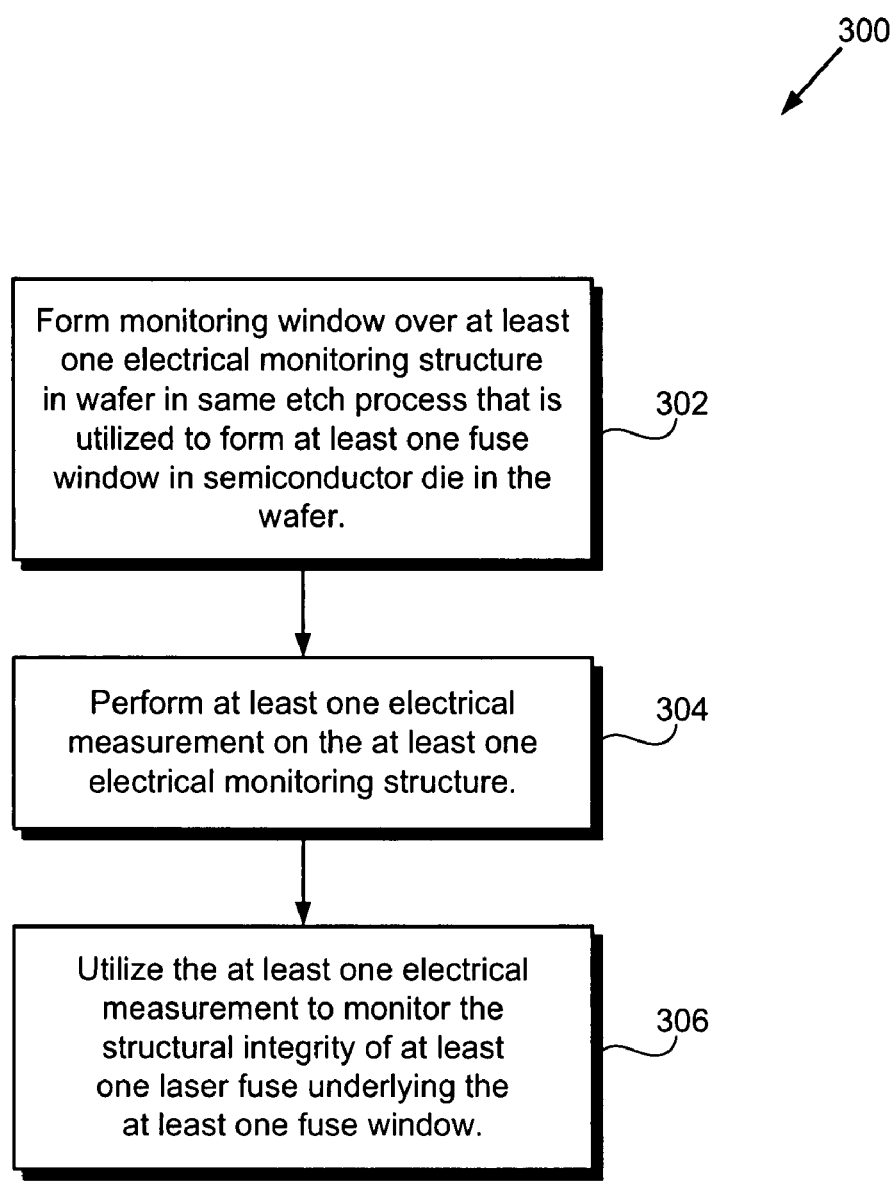
FIG. 3 shows a flowchart illustrating an exemplary method for monitoring laser fuse integrity in accordance with one embodiment of the present invention.

FIG. 3 shows flowchart 300, which describes the steps, according to one embodiment of the present invention, of a method for monitoring laser fuse integrity in a semiconductor die. Certain details and features have been left out of flowchart 300 that are apparent to a person of ordinary skill in the art. For example, a step may consist of one or more substeps or may involve specialized equipment or materials, as known in the art. Steps 302 through 306 indicated in flowchart 300 are sufficient to describe one embodiment of the present invention, other embodiments of the invention may utilize steps different from those shown in flowchart 300. It is noted that the processing steps shown in flowchart 300 are performed on a wafer, which, prior to step 302, can include a number of semiconductor dies, wherein each semiconductor die can include at least one laser fuse underlying a dielectric layer. The wafer can also include a scribe line adjacent to each semiconductor die, wherein each scribe line can include at least one electrical monitoring structure.

At step 302 in flowchart 300, monitoring window 216 is formed over electrical monitoring structure 220 in scribe line 209 in the wafer, i.e., wafer 100, in the same etch process that is utilized to form fuse window 210 in semiconductor die 202. For example, electrical monitoring structure 220 can be a metal comb/serpentine structure comprising metal serpentine line 236 situated between metal combs 238 and 240. For example, monitoring window 216 and fuse window 210 can be formed in a dielectric layer 222 in the same process step and in the same etch process. At step 304, at least one electrical measurement can be performed on electrical monitoring structure 220. For example, a resistance measurement can be performed on electrical monitoring structure 220 by measuring the resistance of metal serpentine line 236. For example, a resistance measurement can be performed on electrical monitoring structure 220 by measuring the resistance between metal comb 238 or metal comb 240 and metal serpentine line 236.

At step 306, the at least one electrical measurement performed on electrical monitoring structure 220 can be utilized to monitor the structural integrity of at least one of laser fuses 224a through 224f underlying fuse window 210. Since monitoring window 216 and fuse window 210 are formed in the same process step and in the same etch process, damage caused to electrical monitoring structure 220 as a result of an anomaly in the etch process can correspond to damage caused to one or more of the laser fuses. Thus, a change in an electrical measurement performed on electrical monitoring structure 220, such as an increase in a resistance of metal serpentine line 236, can be utilized to indicate a change in the electrical integrity of one or more laser fuses underlying fuse window 210.

Thus, in the present invention, by forming a window opening, i.e. the monitoring window, overlying an electrical monitoring structure, such as a metal comb/serpentine structure, in a scribe line in a semiconductor wafer, where the monitoring window is formed in a same process step as a fuse window overlying at least one laser fuse in a semiconductor die in the wafer, electrical measurements performed on the electrical monitoring structure can be advantageously utilized to monitor the structural integrity of the at least one laser fuse. Also, since the invention utilizes an existing electrical monitoring structure, the invention provides a cost effect method and structure for monitoring laser fuse structure integrity. Furthermore, since the invention does not rely on visual inspection, the invention provides a method and structure for monitoring the structural integrity of a laser fuse that is more accurate than a conventional visual inspection approach. Moreover, the invention's approach results in a sample size that is statistically meaningful since the integrity of all (or almost all) laser fuses on the semiconductor wafer can be methodically and systematically analyzed, instead of a conventional random visual inspection of only a few laser fuses that results in a small sample size which may not be statistically meaningful.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for monitoring fuse integrity in a semiconductor die and related structure have been described.

The invention claimed is:

1. A semiconductor wafer comprising:
   a dielectric layer overlying at least one fuse and at least one electrical monitoring structure;
   a fuse window and a monitoring window in said dielectric layer, said fuse window being over said at least one fuse and said monitoring window being over said at least one electrical monitoring structure and laterally spaced apart from said fuse window;
   wherein said at least one electrical monitoring structure indicates a structural integrity of said at least one fuse, and said at least one electrical monitoring structure comprises a metal serpentine line situated adjacent to at least one metal comb.

2. The semiconductor wafer of claim 1, wherein said at least one fuse is a laser fuse.

3. The semiconductor wafer of claim 1, wherein a change in at least one electrical measurement of said at least one electrical monitoring structure indicates a change in said structural integrity of said at least one fuse.

4. The semiconductor wafer of claim 3, wherein said metal serpentine line is situated between interdigitated metal lines of said least one metal comb.

5. The semiconductor wafer of claim 4, wherein said at least one electrical measurement comprises a resistance measurement between said at least one metal comb and said metal serpentine line.

6. The semiconductor wafer of claim 4, wherein said at least one electrical measurement comprises a resistance measurement of said metal serpentine line.

7. The semiconductor wafer of claim 1, wherein said at least one electrical monitoring structure and said at least one fuse are situated in a same interconnect metal layer in said semiconductor wafer.

8. The semiconductor wafer of claim 1, wherein a depth of said monitoring window is approximately equal to a depth of said fuse window.

9. A semiconductor die comprising:
a dielectric layer overlying a laser fuse and an electrical monitoring structure;
a fuse window and a monitoring window in said dielectric layer, said fuse window being over said fuse and said monitoring window being over said electrical monitoring structure and laterally spaced apart from said fuse window;
wherein a change in an electrical measurement of said electrical monitoring structure indicates a change in a structural integrity of said laser fuse, and said electrical monitoring structure comprises a metal line situated adjacent to a metal comb.

10. The semiconductor die of claim 9, wherein said metal line is situated between interdigitated metal lines of said metal comb.

11. The semiconductor die of claim 10, wherein said electrical measurement comprises a resistance measurement between said metal comb and said metal line.

12. The semiconductor die of claim 10, wherein said electrical measurement comprises a resistance measurement of said metal line.

13. The semiconductor die of claim 9, wherein said electrical monitoring structure and said laser fuse are situated in a same interconnect metal layer in said semiconductor die.

14. The semiconductor die of claim 9, wherein a depth of said monitoring window is approximately equal to a depth of said fuse window.

15. The semiconductor die of claim 9, wherein said monitoring window and said fuse window are concurrently formed.

16. The semiconductor die of claim 9, wherein said monitoring window and said fuse window are concurrently formed, and wherein said change in said structural integrity of said laser fuse is caused by damage in a fabrication process.

* * * * *